(12) United States Patent
Jain et al.

(10) Patent No.: US 9,748,940 B2
(45) Date of Patent: Aug. 29, 2017

(54) PULSE WIDTH MODULATION

(71) Applicant: Marvell World Trade Ltd., St. Michael (BB)

(72) Inventors: Kapil Jain, Santa Clara, CA (US); Zining Wu, Los Altos, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 15/017,010

(22) Filed: Feb. 5, 2016

(65) Prior Publication Data

US 2016/0233855 A1 Aug. 11, 2016

Related U.S. Application Data

(60) Provisional application No. 62/113,790, filed on Feb. 9, 2015.

(51) Int. Cl.
H03K 3/017 (2006.01)
H03K 5/04 (2006.01)
H03K 7/08 (2006.01)

(52) U.S. Cl.
CPC .................................... H03K 7/08 (2013.01)

(58) Field of Classification Search
CPC .. H03K 5/01; H03K 5/04; H03K 5/05; H03K 5/06; H03K 5/065; H03K 5/07; H03K 3/017; H03K 5/1565; H03K 7/08
USPC .................................................. 327/172, 175
See application file for complete search history.

(56) References Cited

U.S. PATENT DOCUMENTS

| 5,901,176 A | * | 5/1999 | Lewison | ................... H03K 7/08 |
| | | | | 332/109 |
| 6,549,085 B1 | | 4/2003 | Wagh | |
| 2002/0093391 A1 | | 7/2002 | Ishida | |
| 2005/0134343 A1 | | 6/2005 | Goto | |
| 2010/0225391 A1 | | 9/2010 | Kim | |

FOREIGN PATENT DOCUMENTS

EP    1713175 A1    10/2006

OTHER PUBLICATIONS

European Patent Application No. 16154780.7, Extended European Search Report dated Jul. 8, 2016, 8 pages.

* cited by examiner

*Primary Examiner* — Lincoln Donovan
*Assistant Examiner* — Diana J Cheng

(57) ABSTRACT

A device includes a combining circuitry that receives an incoming signal, and one or more delayed signals from a delay circuitry. The combining circuitry combines the incoming signal and the one or more delayed signals to generate a combined signal. The device includes a comparing circuitry that receives the combined signal from the combining circuitry, and compares a pulse width of the combined signal to a threshold pulse width. When the pulse width of the combined signal is greater than or equal to the threshold pulse width, the comparing circuitry provides the combined signal to an amplifier circuit and provides a null signal to the delay circuitry. The amplifier circuit generates a pulse width modulated (PWM) signal based on the combined signal.

20 Claims, 5 Drawing Sheets

PULSE WIDTH MODULATION

CROSS REFERENCE TO RELATED APPLICATIONS

This application claims the benefit of the priority of U.S. Provisional Application Ser. No. 62/113,790, filed on Feb. 9, 2015, and entitled "Method for Single Ended Pulse Width Modulation", which is incorporated herein by reference in its entirety.

BACKGROUND

The following disclosure relates generally to systems and techniques for pulse width modulation.

A signal amplifier that is used to generate signals with pulse width modulation (PWM) includes an output driver circuit that transitions between high and low states to generate the signal pulses. Finite delays in the output driver circuit's transition between the high and low states can introduce errors in the PWM signal generated by the signal amplifier.

SUMMARY

The present disclosure describes systems and techniques for generating a PWM signal by a signal amplifier, where the width of signal pulses generated by the signal amplifier are equal to or greater than a minimum pulse width (MPW) associated with the signal amplifier. The MPW, which is based on an operational bandwidth of the output driver circuit of the signal amplifier, represents the minimum pulse width of a PWM signal that can be generated by the signal amplifier to achieve certain desired signal performance metrics, for example, signal to noise ratio (SNR) above a threshold value.

The systems and techniques for generating PWM signals disclosed herein enable easy design implementation of a PWM signal amplifier, for example in a digital complementary metal-oxide semiconductor (CMOS) domain. These systems and techniques can result in increased efficiency of the signal amplifier due to reduced power consumption of the output driver circuit. This may be the case, for example, because the output driver circuit generates pulses for a subset of the input signal samples, which have pulse widths greater than the MPW. The systems and techniques can also lead to reduced energy levels in the radio frequency (RF) band, and thereby help mitigate electromagnetic interference (EMI) issues associated with the PWM signal.

The details of one or more disclosed implementations are set forth in the accompanying drawings and the description below. Other features, aspects, and advantages will become apparent from the description, the drawings and the claims.

DETAILED DESCRIPTION

Pulse width modulation (PWM) refers to a modulation technique used to encode a message into a pulsing signal. PWM can be used to encode information for transmission, or to allow control of power supplied to electrical devices, for example, audio amplifiers or inertial loads such as motors, among other uses. Pulse width modulation uses a rectangular pulse wave whose pulse width is modulated resulting in the variation of the average value of the waveform. A PWM signal can be generated by turning a switch in an amplifier output driver circuit on and off at a fast rate, corresponding to signal samples that are provided at the input to the driver circuit. The longer the switch is on, as compared to the off periods, the wider the pulse and correspondingly greater signal energy is delivered at the output. When a switch is off, there is no pulse generated at the output. Typically, the switching frequency is in the order of tens or hundreds of kilohertz (kHz) in audio amplifiers and computer power supplies.

A PWM signal can be generated by class-D modulation, which uses a class-D amplifier or switching amplifier to generate the signal pulses. A class-D amplifier or switching amplifier is an electronic amplifier in which the active amplifying devices (for example, transistors) operate as electronic switches. The signal to be amplified is a train of constant amplitude pulses, so the amplifying devices switch rapidly back and forth between a fully conductive and nonconductive state. The signal to be amplified is converted to a series of pulses by PWM, or some other suitable method, before being applied to the amplifier. A class-D amplifier can be more efficient than analog amplifiers, with less power dissipated as heat in the amplifying devices.

The output driver circuit of some signal amplifiers include a single-ended amplifier, which receives a signal at a single input and amplifies the difference between the received signal and ground to generate a single-ended PWM signal. A single-ended PWM signal can be used in various scenarios. For example, a single-ended PWM signal can be used to drive a headphone output, where each terminal of the headphone produces a single-ended output.

Figure 1:
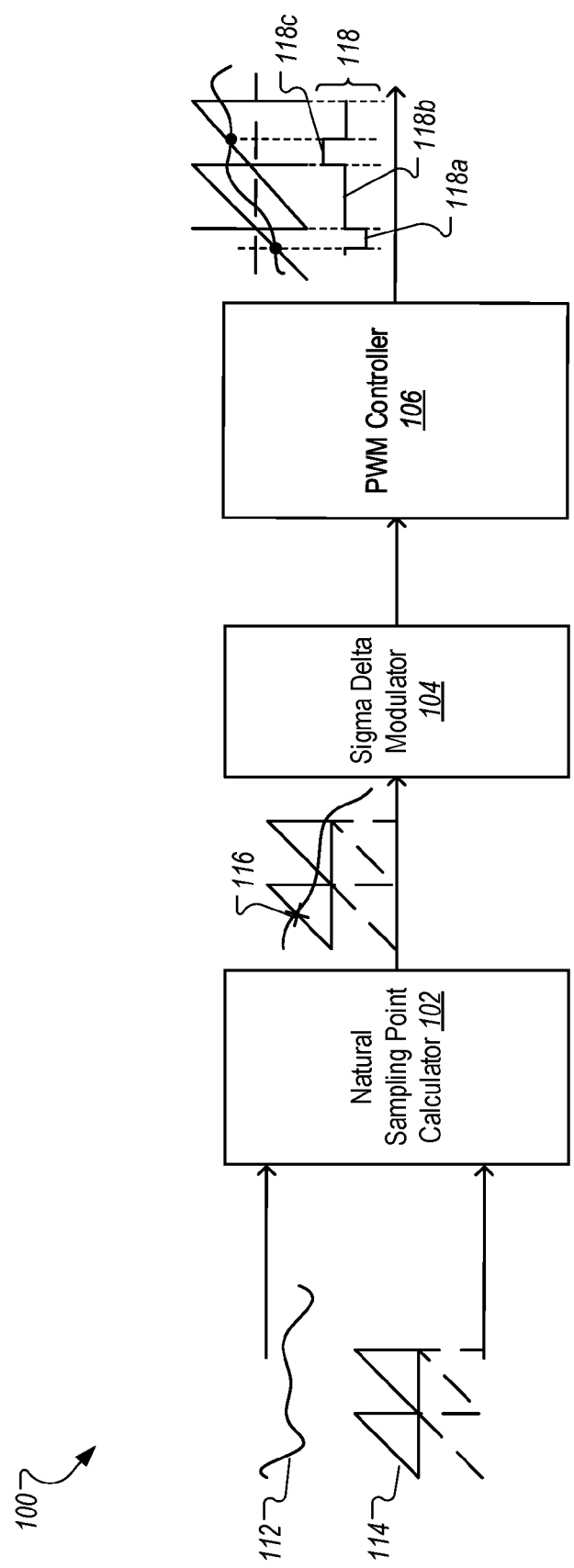
FIG. 1 illustrates a block diagram of an example of a signal amplifier device that generates a single-ended PWM signal.

FIG. 1 illustrates a block diagram of an example of a signal amplifier device 100 that generates a single-ended PWM signal. The signal amplifier device 100 includes a natural sampling point calculator 102, a sigma delta modulator 104 and a PWM controller 106.

The signal amplifier 100 receives a signal 112 at a first input of the natural sampling point calculator 102, and a reference waveform 114 at a second input of the natural sampling point calculator 102. The signal 112, which represents the signal that is to be modulated, can be an analog signal or a digital signal. The reference waveform 114 can be a sawtooth waveform, a triangular waveform with a leading edge or a trailing edge, or some other suitable waveform.

The natural sampling point calculator 102 compares the waveform of the input signal 112 to the reference waveform 114 to find crossing points at which the signal 112 waveform intersects the reference waveform 114, for example crossing point 116. The natural sampling point calculator 102 provides the determined crossing points of the signal 112 to the sigma delta modulator 114.

In some implementations, the natural sampling point calculator 102 generates a pulse train of a specified period corresponding to the determined crossing points of the signal 112. Each pulse in the pulse train is represented by a certain number of bits, for example 24 bits. The natural sampling point calculator 102 provides a bit stream for the pulse train to the sigma delta modulator 104.

The sigma delta modulator 104 is configured to compress the number of bits received from the natural sampling point calculator 102, while preserving the SNR for the incoming signal. For example, each pulse corresponding to a crossing point may be represented by 24 bits in the pulse train bit stream that is received from the natural sampling point calculator 102. The sigma delta modulator 104 may compress the 24 bits to a lower number of bits, for example 4 or 5 bits, while still preserving the SNR for the incoming signal 112.

The sigma delta modulator 104 provides the compressed pulse train bit stream to the PWM controller 106, which is configured to manage the output driver circuit for the signal amplifier device 100. In some implementations, the amplifier output driver circuit is a part of the PWM controller circuit.

The PWM controller 106 generates a PWM signal 118 with pulse widths that are proportional to the compressed number of bits used to represent each crossing point. The output driver circuit in the PWM controller may include one or more class-D amplifier switches. When the PWM signal 118 is a single-ended PWM signal, it may be generated using a single input class-D switch in the PWM controller 106. The PWM signal 118 may be a 3-level signal, which includes a negative level (for example, 118a), a zero level (for example, 118b) and a positive level (for example, 118c).

In some implementations, the performance of the signal amplifier device 100 depends on the performance of the class-D switching amplifier in the output driver circuit, which is constrained by the speed at which the switch can open, for example, transition from an OFF state to an ON state, and the speed at which the switch can close, for example, transition from the ON state to the OFF state. In some implementations, the OFF state correspond to a low or "0" level of voltage or current generated by the switching amplifier, while the ON state corresponds to a high or "1" level of voltage or current generated by the switching amplifier. To output a signal pulse with a certain pulse width, the PWM controller 106 turns on the class-D amplifier, for example, transitions the amplifier switch from the low level to the high level, and keeps the switch open for a time duration proportional to the pulse width. Once the pulse has been generated, the PWM controller 106 turns off the amplifier driver, for example, transitions the amplifier switch from the high level to the low level.

In some implementations, the OFF state corresponds to the high level, while the ON state can correspond to the low level. In such cases, the PWM controller 106 controls the class-D amplifier to transition the amplifier switch from the high level to the low level to output the signal with a certain pulse width, and transitions the amplifier switch from the low level to the high level when the desired pulse has been generated.

Figure 2:
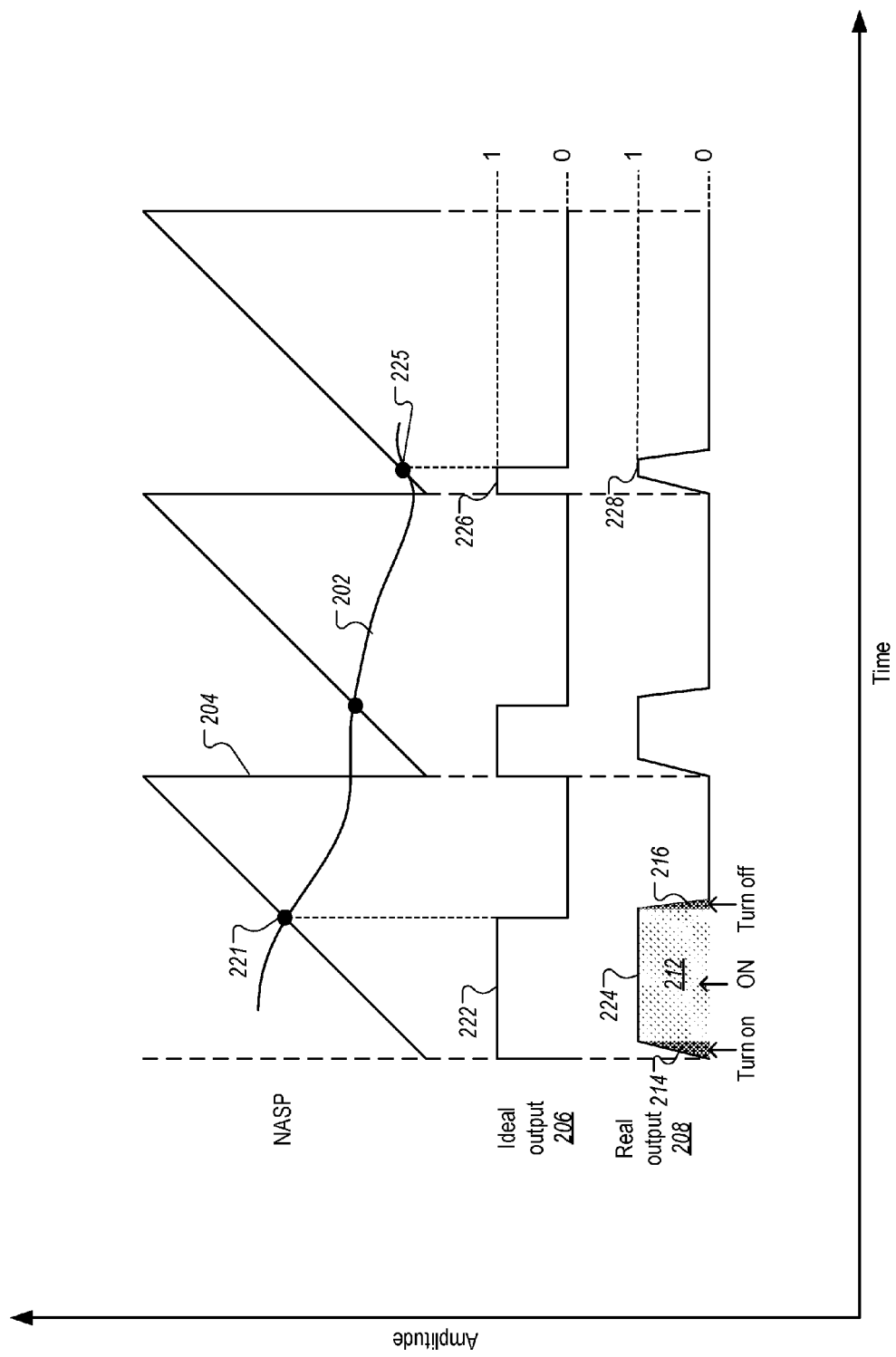
FIG. 2 illustrates examples of signals associated with a single-ended PWM amplifier device.

FIG. 2 illustrates examples of signals associated with a single-ended PWM amplifier device. In some implementations, these signals correspond to the signal amplifier 100.

As shown, a natural sampling point calculator finds crossing points, such as 221 and 225, between an input waveform 202 and a reference waveform 204. The input waveform 202 may be similar to the input signal 112 waveform, while the reference waveform 204 may be similar to the reference waveform 114. In an ideal situation, the amplifier output driver can transition between the high and low levels instantaneously, thereby providing an ideal or desired PWM signal output 206, where the pulse width 222 is precisely aligned with the corresponding crossing point 221 and the pulse width 226 is precisely aligned with the corresponding crossing point 225. However, in an actual implementation, the amplifier driver switch has a finite non-zero turn-on (rise) time and a non-zero turn-off (fall) time. Due to these finite transition times, the real output 208 of the amplifier driver circuit deviates from the square waveform of the ideal output 206. For example, as shown, the real pulse widths 224 or 228 are different from the ideal pulse widths 222 or 226, respectively. These finite transition times are dependent on the physical characteristics of the transistors in the output driver, and they represent the time taken by the transistors to change state.

A performance measure of a single ended amplifier is how faithfully and accurately the amplifier can deliver desired signal energy at the output. The amount of pulse energy that is delivered at the output is the area under the output waveform, which depends on the speed with which the amplifier driver can transition between high and low levels. Due to the finite transition times of the amplifier driver switch, the total pulse energy in the real output can be different from the total pulse energy in the ideal output. For example, in ideal conditions, the total energy in the pulse 224 would correspond to the area 212 under the curve. However, due to the finite turn on time, an additional amount of energy, which is represented by the area 214, is added to the pulse 224. Due to the finite turn off time, another additional amount of energy, which is represented by the area 216, is added to the pulse 224.

In some implementations, the difference between the desired or ideal output (for example, energy represented by the area 212) and the real output (for example, energy represented by the areas 212, 214 and 216 combined) is referred to as the error of the signal amplifier device. The error may manifest as noise in the output PWM signal, thereby lowering the SNR of the PWM signal.

When the desired pulse width is large, a closed-loop PWM amplifier driver can make the error between the desired output and the real output a small fraction of the total energy under the curve. For example, for the pulse width 224, the error due to the additional energy represented by areas 214 and 216 may be a small percentage of the desired energy represented by area 212. By using a feedback loop, the closed-loop PWM driver can determine a desired amount of energy that is to be delivered for a given pulse width. Based on determining the amount of energy, the closed-loop PWM driver can attempt to turn off the amplifier driver ahead of time to compensate for the additional energy introduced due to the finite transition times of the driver switch. In such situations, the amplifier can have high performance, since it is able to deliver the desired amount of energy at the output with low error.

However, as the pulse width reduces, the error between the desired output and real output can have a greater impact on the amplifier output. For example, when the desired pulse width is small (such as 226), then the additional energy in the real output pulse (such as 228) due to the finite transition times of the amplifier driver switch can be a substantial percentage of the total signal energy at the output. In such situations, the feedback loop in a closed-loop PWM amplifier may not able to perform with the speed needed to compensate for the finite transition times of the amplifier driver, and therefore the amplifier can exhibit poor performance. In such scenarios, high performance can be achieved by increasing the operational bandwidth of the amplifier driver. However, an increase in the operational bandwidth of the amplifier driver can lead to increased design cost and effort.

It may be useful to design a simplified single-ended amplifier driver circuit with a reasonable design cost that delivers the desired signal energy at the output with low error. This can be achieved by determining a minimum pulse width (MPW) for the single-ended amplifier based on a given operational bandwidth of the amplifier driver circuit, such that the error in signal energy due to the finite transition times of the driver circuit is within an acceptable percentage of the total signal energy at the output. Accordingly, the MPW identifies a breaking point below which the amplifier performance will degrade. The error can be measured by a threshold SNR of the PWM signal delivered at the output of the amplifier driver circuit. For example, the threshold SNR may be set at 120 dB as a design parameter. Then a minimum pulse width may be determined for which the amount of noise introduced in the output pulses due to the finite transition times of the amplifier driver circuit is such that the SNR of the output PWM signal is at least 120 dB. For pulses below this determined minimum pulse width, the additional energy due to the finite switch transition times may introduce noise that causes the SNR to be lower than 120 dB.

By generating the output PWM signal based on the minimum pulse width, the design constraints of the signal amplifier device can be relaxed, for example, an amplifier driver with a limited operational bandwidth can be used to generate a PWM signal with a level of accuracy that would otherwise (for example, in the absence of the minimum pulse width design parameter) require a driver with greater operational bandwidth. Accordingly, a signal amplifier device with a minimum pulse width parameter can lead to easy design implementation at a reasonable cost and effort.

Figure 3:
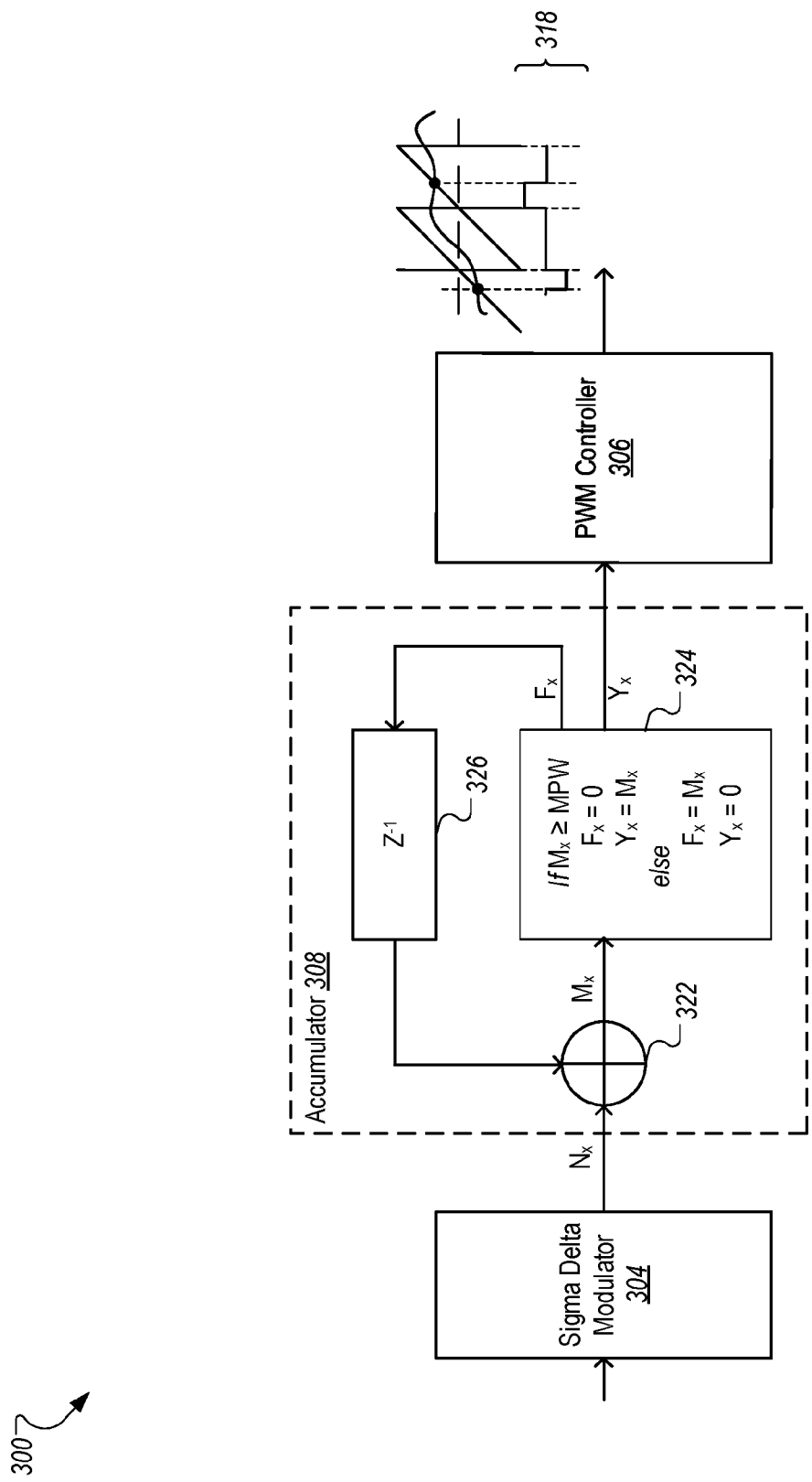
FIG. 3 illustrates a block diagram of an example of a signal amplifier device that generates a single-ended PWM signal with a minimum pulse width, according to one or more implementations.

FIG. 3 illustrates a block diagram of an example of a signal amplifier device 300 that generates a single-ended PWM signal with a minimum pulse width, according to one or more implementations. The signal amplifier device 300 includes a sigma delta modulator 304, a PWM controller 306 and an accumulator 308. The accumulator 308 includes an adder 322, a comparing circuit 324 and a delay circuit 326.

The sigma delta modulator 304 generates a signal $N_x$ with a number of bits that represents the desired pulse width of the output PWM signal corresponding to an input waveform. In some implementations, the sigma delta modulator 304 is similar to the sigma delta modulator 104. A natural sampling point calculator also may be included in the device 300. As noted previously, the sigma delta modulator 304 may receive, from the natural sampling point calculator, a pulse train corresponding to determined crossing points of an input signal. Each pulse in the pulse train may be represented by a certain number of bits. The sigma delta modulator 304 may compress the input number of bits for each pulse to generate $N_x$.

The sigma delta modulator 304 provides the compressed signal $N_x$ corresponding to the incoming pulse width to the accumulator 308. The accumulator 308 can delay signals that it receives by buffering them, for example in the delay circuit 326. If such delayed signals are present when $N_x$ is received, then the adder 322 performs a linear combination of $N_x$ with the delayed signals to generate a combined signal $M_x$, and provides $M_x$ to the comparing circuit 324. In some implementations, the linear combination is performed by adding the delayed signals to $N_x$. Suitable alternative combination operations are also possible. If no delayed signals are buffered when $N_x$ is received at the accumulator 308, then the adder 322 provides $N_x$ to the comparing circuit 324. In such cases, the incoming signal $N_x$ and the combined signal $M_x$ are the same.

The comparing circuit 324 compares the pulse width corresponding to the combined signal $M_x$ to the minimum pulse width (MPW) for the signal amplifier device 300. As noted above, the MPW is a design parameter for the device 300. The MPW is a function of the operational bandwidth of the amplifier driver circuit in the PWM controller 306, and a desired minimum SNR for signals generated by the device 300, which is the threshold SNR for the device 300. The MPW is determined such that the PWM controller 306 can generate PWM signals with SNR above or equal to the threshold SNR, for the given operational bandwidth of the amplifier driver circuit. When the widths of the pulses generated by the PWM controller 306 are greater than or equal to the MPW, the threshold SNR requirement is met. However, if the widths of one or more pulses are less than the MPW, then the SNR may be less than the threshold SNR, thereby leading to poor performance of the amplifier device 300.

The comparing circuit 324 provides the combined signal $M_x$ to the PWM controller 306 (i.e., $Y_x=M_x$) when the pulse width corresponding to the combined signal $M_x$ is greater than or equal to the MPW for the amplifier device 300. The signal $F_x$ provided to the delay circuit 326 is null (i.e., $F_x=0$). In such cases, the delay circuit does not hold any signals for later processing. The PWM controller 306 will generate a pulse for the output PWM signal 318 with a pulse width that corresponds to $M_x$, which is greater than or equal to the MPW for the amplifier device 300.

On the other hand, if the combined signal $M_x$ is less than the MPW for the amplifier device 300, then the comparing circuit 324 provides a null output $Y_x$ (i.e., $Y_x=0$) to the PWM controller 306, while forwarding the signal $M_x$ to the delay circuit 326 (i.e., $F_x=M_x$). The PWM controller 306 will generate a zero pulse width at its output for the PWM signal 318 corresponding to the null signal $Y_x$.

In such circumstances, the delay circuit 326 buffers $M_x$. In the next cycle, the adder 322 combines the delayed signal $M_x$, which is retrieved from the delay circuit 326, with the next incoming signal $N_x$, and provides the updated combined signal $M_x$ to the comparing circuit 324 for comparing with the MPW, as described above. The combined signal $M_x$ at a time instant t can therefore be represented by equation (1). As noted above and demonstrated by equation (1), in some cases the combined signal that is output to the PWM controller 306 is an incoming signal $N_x$ that has a pulse width greater than or equal to the MPW.

$$M_x(t)=N_x(t)+M_x(t-1), \text{ where } M_x(t-1) \geq 0 \qquad (1)$$

In this manner, the accumulator 308 can keep on delaying and accumulating signals with pulse widths that are less than the MPW, until the pulse width of the combined signal, which is generated by adding all the delayed signals, is larger than or equal to MPW.

During the period the accumulator 308 delays the input signal, the PWM controller 306 will deliver a zero pulse width at its output by driving a zero value at the output of the amplifier driver circuit. Accordingly, the output PWM signal 318 may not have pulses corresponding to some crossing points of the input signal. However, the pulses generated for the PWM signal 318 will have widths that are above or equal to the minimum pulse width for the amplifier device 300, such that the PWM signal 318 satisfies the threshold SNR requirement for the device 300. Since the amplifier circuit drives a zero value at its output when not generating pulses, this can result in higher efficiency of single-ended PWM amplifier compared to PWM amplifiers without the accumulator 308 (for example, closed-loop PWM amplifiers).

Although FIG. 3 shows the accumulator 308 using the adder circuit 322 to add the signals, other implementations are also possible. For example, the adder circuit 322 can be any suitable circuit that is configured to combine multiple signals together.

Figure 4:
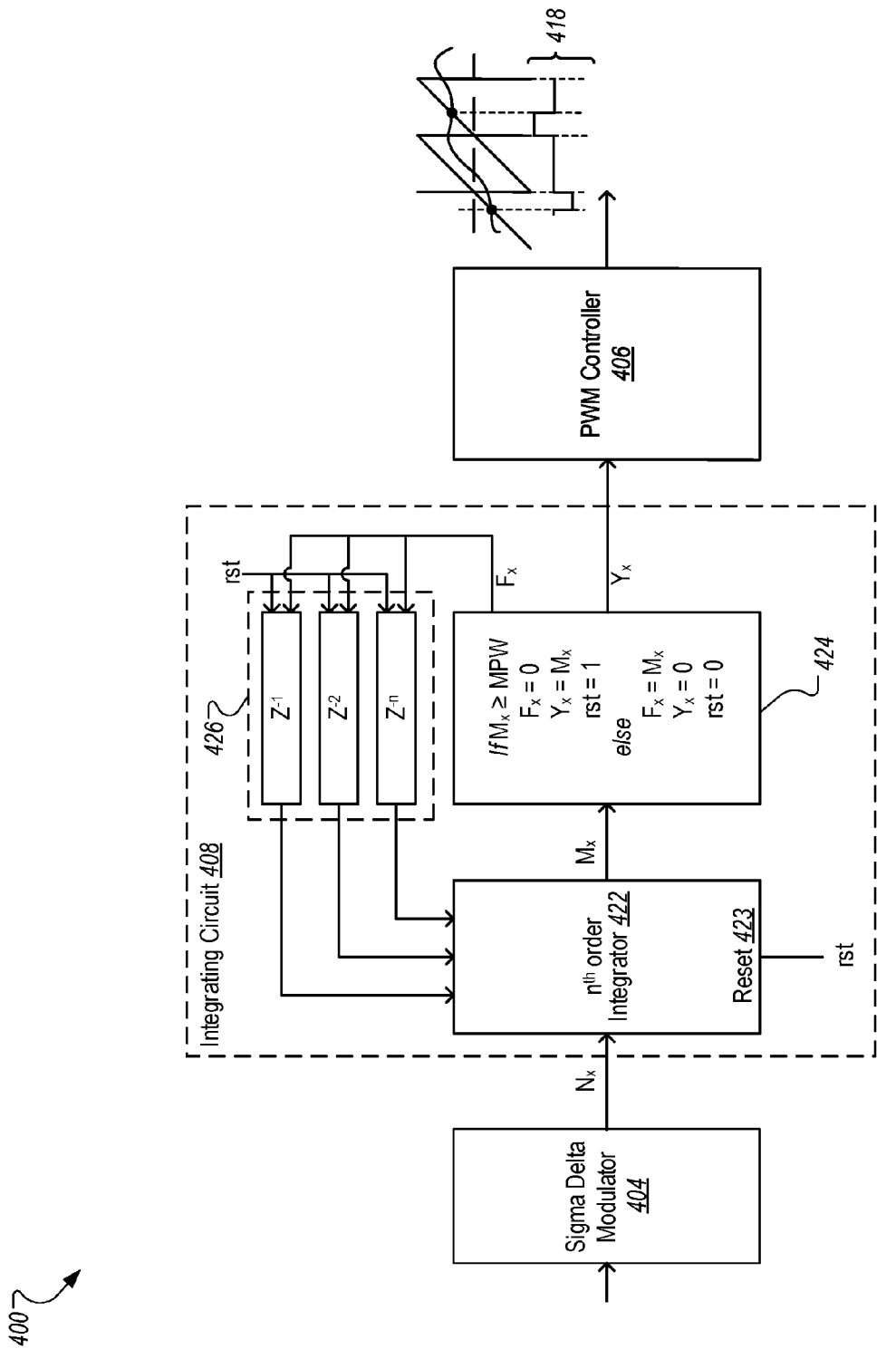
FIG. 4 illustrates a block diagram of a second example of a signal amplifier device that generates a single-ended PWM signal with a minimum pulse width, according to one or more implementations.

FIG. 4 illustrates a block diagram of a second example of a signal amplifier device 400 that generates a single-ended PWM signal with a minimum pulse width, according to one or more implementations. The signal amplifier device 400 includes a sigma delta modulator 404, a PWM controller 406 and an integrating circuit 408. The integrating circuit 408 includes an $n^{th}$ order integrator 422 (where n is an integer≥0), a comparing circuit 424 and a delay circuit 426.

In a manner similar to the sigma delta modulator 304, the sigma delta modulator 404 generates a signal $N_x$ with a number of bits that represents the desired pulse width of the output PWM signal corresponding to an input waveform, and provides the signal $N_x$ to the integrating circuit 408. As noted previously, the signal $N_x$ provided by the sigma delta modulator 404 may include a reduced number of bits compared to the pulse train received from a natural sampling point calculator. The signal amplifier 400 may include a natural sampling point calculator for such purposes.

The integrating circuit 408 is configured to buffer delayed signals. The $n^{th}$ order integrator 422 performs a weighted integration of $N_x$ with up to n delayed signals to generate a combined signal $M_x$, and provides $M_x$ to the comparing circuit 424. In some implementations, there are less than n buffered signals, for example m<n signals are buffered (where m is an integer). In such cases, when $N_x$ is received at the integrating circuit 408, then the $n^{th}$ order integrator 422 combines $N_x$ with m delayed signals and provides the combined signal $M_x$ to the comparing circuit 424. The amplifier device 400 can achieve higher performance by using a higher order integrator.

If no delayed signals are buffered when $N_x$ is provided as an input to the integrating circuit 408, then the $n^{th}$ order integrator 422 provides $N_x$ to the comparing circuit 424. In such cases, the incoming signal $N_x$ and the combined signal $M_x$ are the same.

The weighted integration is performed by using coefficients to weight the delayed signals. Different coefficients may be associated with different delayed signals, or similar coefficients may be associated with some delayed signals that are different from coefficients associated with other delayed signals. In some implementations, a single coefficient may be applied to all delayed signals.

The coefficients are determined based on one or more parameters associated with the amplifier device 400. For example, the coefficients may be a function of the amplifier driver in the PWM controller 406, or the modulation scheme employed to generate the output signal 418, or both. In some implementations, the coefficients are computed by regression analysis. For example, the amplifier device 400 may set one or more desired performance metrics for the output signal 418, such as SNR, total harmonic distortion+noise (THD+N), or EMI, based on the operational characteristics of the amplifier driver circuit. The amplifier device 400 may determine actual values of SNR, THD+N, or EMI that are received for an input signal, and compute the integration coefficients to compensate for the difference in the input signal metrics and the desired output performance metrics. In some implementations, the amplifier device 400 adjusts previously computed coefficients based on the received input signal. For example, the coefficient adjustment may be performed to avoid degradation in the output SNR, and/or to avoid spikes in the output signal due to harmonic distortion.

The comparing circuit 424 compares the pulse width corresponding to the combined signal Mx to the minimum pulse width (MPW) for the signal amplifier device 400. As noted previously, the MPW is a function of the operational bandwidth of the amplifier driver circuit in the PWM controller 406, and the desired threshold SNR for the device 400. The MPW is determined such that the PWM controller 406 can generate PWM signals with SNR above or equal to the threshold SNR, for the given operational bandwidth of the amplifier driver circuit.

If the pulse width corresponding to the combined signal $M_x$ is greater than or equal to the MPW for the amplifier device 400, then the comparing circuit 424 provides the combined signal $M_x$ to the PWM controller 406 (i.e., $Y_x=M_x$). No incoming signal is delayed, such that the signal $F_x$ provided to the delay circuit 426 is null (i.e., $F_x=0$). The comparing circuit 424 also generates a reset signal rst, which is used to reset the buffers in the delay circuit 426. The reset signal is also provided to the $n^{th}$ order integrator 422 (for example, at Reset input 423) to reset the integrator. The PWM controller 406 generates a pulse for the output PWM signal 418 with a pulse width that corresponds to $M_x$ and is greater than or equal to the MPW for the amplifier device 400.

On the other hand, if the combined signal $M_x$ is less than the MPW for the amplifier device 400, then the comparing circuit 424 provides the a null output (i.e., $Y_x=0$) to the PWM controller 406, while delaying the signal $M_x$, which is provided to the delay circuit 426 (i.e., $F_x=M_x$). The PWM controller 306 generates a zero pulse width at its output for the PWM signal 418 corresponding to the null signal $Y_x$.

The components of the delayed signal $M_x$ include previously received incoming signals. The delay circuit applies a coefficient, which is described above, to each component of the delayed signal $M_x$. For example, the delay circuit 426 may apply a first coefficient (represented by $z^{-1}$) to a first component of the delayed signal $M_x$, a second coefficient (represented by $z^{-2}$) to a second component of the delayed signal $M_x$, up to an $n^{th}$ coefficient (represented by $z^{-n}$) to an $n^{th}$ component of the delayed signal $M_x$.

In the next cycle, the $n^{th}$ order integrator performs a weighted integration of the delayed signal, in which each component is suitably weighted by a coefficient, with the next incoming signal $N_x$, and provides the updated combined signal $M_x$ to the comparing circuit 424 for checking against the MPW, as described above. In this manner, the integrating circuit 408 can delay signals with pulse widths that are less than the MPW, until the pulse width of the combined signal, which is generated by integrating all the delayed signals, is larger than or equal to the MPW for the respective amplifier device.

The signal amplifier device 400 illustrates a generalized implementation of a PWM amplifier that provides a PWM signal with SNR above a threshold value, by delaying incoming signals until a minimum pulse width is satisfied for the output PWM signal. Although the disclosed implementation describes performing a weighted integration of the delayed signals, other suitable approaches are also possible. For example, in some implementations, the $n^{th}$ order integrator can perform non-weighted integration of up to n delayed signals with the incoming signal $N_x$.

Figure 5:
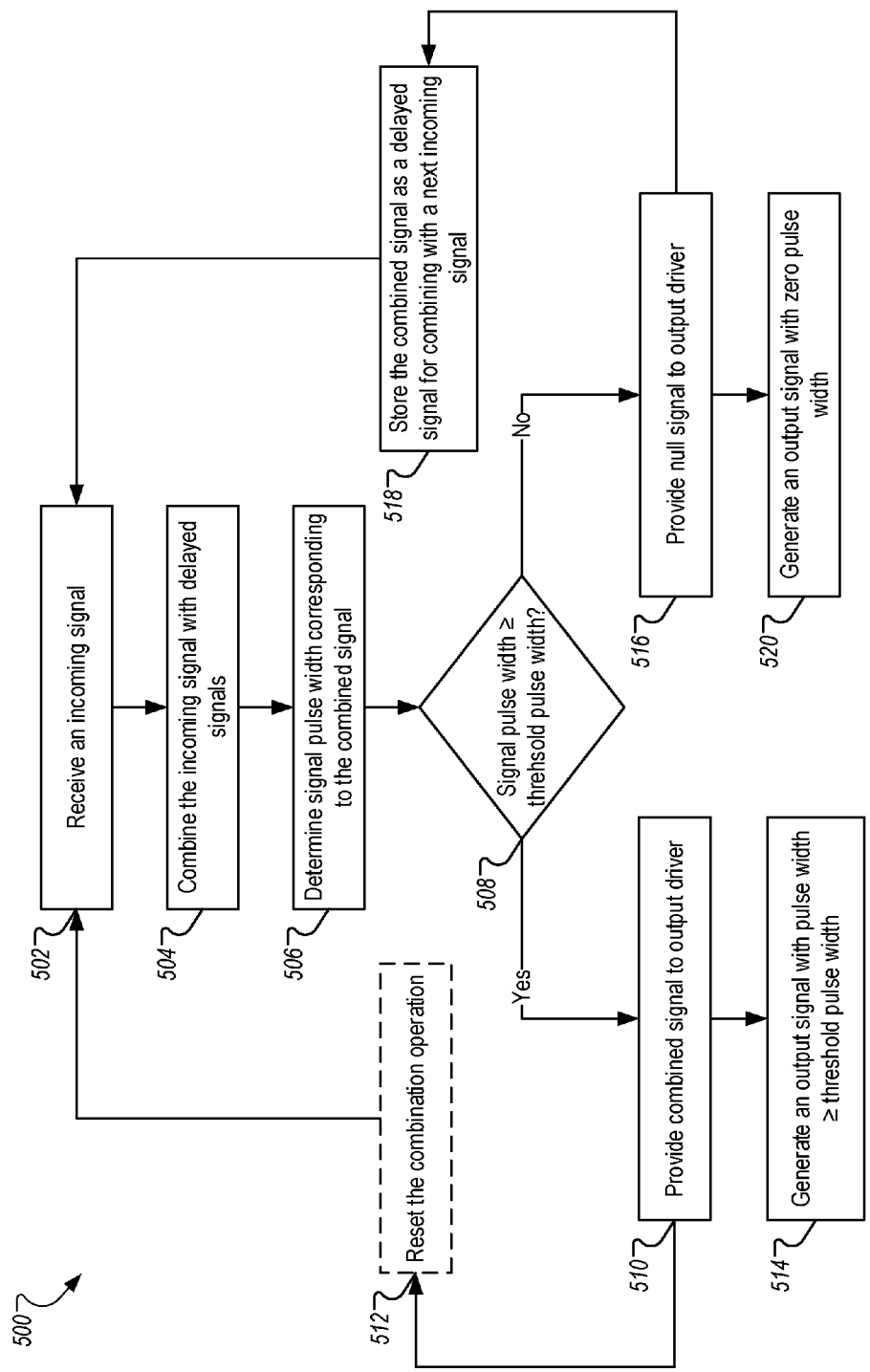
FIG. 5 illustrates an example of a process for generating a single-ended PWM signal with a minimum pulse width, according to one or more implementations.

FIG. 5 illustrates an example of a process 500 for generating a single-ended PWM signal with a minimum pulse width, according to one or more implementations. For example, the process 500 may be performed by the amplifier device 300 or the amplifier device 400. Accordingly, the following sections describe the process 500 with respect to the device 300 and the device 400. However, the process 500 also may be performed by other suitable signal amplifiers.

In some implementations, the process 500 is performed by one or more processors, which are associated with the amplifier device 300 or the device 400 and which execute instructions stored in memory coupled to the respective device. The instructions may represent routines that are configured to delay and combine incoming signals until a minimum pulse width (MPW) is satisfied for the output PWM signal. The routines are configured to determine the MPW for the device based on one or more device characteristics, such as the operational bandwidth of the amplifier output driver circuit.

At 502, an amplifier device receives an incoming signal. For example, the accumulator 308 or the integrating circuit 408 receives an input signal $N_x$ from the sigma delta modulator 304 or 404, respectively.

At 504, the amplifier device combines the incoming signal with delayed signals. For example, the adder 322 adds an incoming signal $N_x$, which is received from the sigma delta modulator 304, to one or more delayed signals buffered in the delay circuit 326, if such delayed signals are available in the accumulator 308 when the signal $N_x$ is received. The adder 322 provides the combined signal $M_x$ to the comparing circuit 324. Similarly, the $n^{th}$ order integrator 422 performs a weighted integration of one or more delayed signals, which are buffered in the delay circuit 426, with an incoming signal $N_x$, which is received from the sigma delta modulator 404. The $n^{th}$ order integrator 422 provides the combined signal $M_x$ to the comparing circuit 424.

At 506, the amplifier device determines a pulse width corresponding to the combined signal. For example, the comparing circuit 324 or the comparing circuit 424 determines a pulse width corresponding to a number of bits representing the combined signal $M_x$, which is received from the adder 322 or the $n^{th}$ order integrator 422 respectively.

At 508, the amplifier device determines whether the signal pulse width corresponding to the combined signal is greater than or equal to a threshold pulse width. For example, the threshold pulse width for the signal amplifier 300 and/or the signal amplifier 400 may be the minimum pulse width (MPW) that is determined for the respective amplifier. The comparing circuity 324 compares the pulse width corresponding to the combined signal $M_x$ to the MPW for the signal amplifier 300, while the comparing circuity 424 compares the pulse width corresponding to the combined signal $M_x$ to the MPW for the signal amplifier 400.

At 510, if the signal pulse width is determined to be greater than or equal to the threshold pulse width, then the amplifier device provides the combined signal to the output driver. For example, the comparing circuit 324 provides the combined signal $M_x$ to the PWM controller 306 when the pulse width corresponding to the combined signal is determined to be greater than or equal to the MPW for the amplifier 300. Similarly, the comparing circuit 424 provides the combined signal $M_x$ to the PWM controller 406 when the pulse width corresponding to the combined signal is determined to be greater than or equal to the MPW for the amplifier 400.

At 512, in some implementations, the amplifier device resets the combination operation, in addition to providing the combined signal to the output driver at 510. For example, in addition to providing the combined signal $M_x$ to the PWM controller 406 as described at 510, the comparing circuit 424 generates a reset signal rst to reset the delay circuit 426 and the nth order integrator 422, when the combined signal with a pulse width greater than or equal to the MPW for the amplifier 400 is provided to the PWM controller 406. However, such a reset signal may not be generated by the comparing circuit 324 in the amplifier 300.

At 514, the amplifier device generates an output signal with a pulse width greater than or equal to the threshold pulse width. For example, the PWM controller 306 controls a class-D amplifier output driver included in the controller to generate pulses for the PWM signal 318 based on the combined signal $M_x$ received from the comparing circuit 324. The widths of the generated pulses are greater than or equal to the MPW for the amplifier device 300. Similarly, the PWM controller 406 controls a class-D amplifier output driver included in the controller to generate pulses for the PWM signal 418 based on the combined signal $M_x$ received from the comparing circuit 424. The widths of the generated pulses are greater than or equal to the MPW for the amplifier device 400.

Considering again the comparison at 508, if the signal pulse width is determined to be less than the threshold pulse width, then at 516 the amplifier device provides a null signal to the output driver. For example, the comparing circuit 324 provides a null signal ($Y_x=0$) to the PWM controller 306 when the pulse width corresponding to the combined signal $M_x$ is determined to be less than the MPW for the amplifier 300. Similarly, the comparing circuit 424 provides a null signal ($Y_x=0$) to the PWM controller 406 when the pulse width corresponding to the combined signal $M_x$ is determined to be less than the MPW for the amplifier 400.

At 518, the amplifier device stores the combined signal as a delayed signal for combining with a next incoming signal. For example, when the pulse width corresponding to the combined signal $M_x$ is determined to be less than the MPW for the amplifier 300, the comparing circuit 324 forwards the combined signal $M_x$ to the delay circuit 326, which buffers the combined signal. When a new signal $N_x$ is received at the accumulator 308, the adder 322 combines the new $N_x$ with the combined signal $M_x$ from the previous cycle that is buffered by the delay circuit 326. Similarly, when the pulse width corresponding to the combined signal $M_x$ is determined to be less than the MPW for the amplifier 400, the comparing circuit 424 forwards the combined signal $M_x$ to the delay circuit 426, which buffers the combined signal. When a new signal $N_x$ is received at the integrating circuit 408, the $n^{th}$ order integrator 422 integrates the new $N_x$ with the combined signal $M_x$ from the previous cycle that is buffered by the delay circuit 426. Individual components of the combined signal $M_x$ (for example, discrete incoming signals received in previous cycles that have pulse widths less than the MPW for the device 400 and are accordingly buffered) are weighted with suitable coefficients by the delay circuit 426 prior to the integration.

At 520, the amplifier device generates an output signal with a zero pulse width. For example, upon receiving a null signal from the comparing circuit 324, the PWM controller 306 delivers a zero pulse width at its output by driving a zero value at the output of its amplifier driver circuit. Accordingly, the output PWM signal 318 may not have pulses at the corresponding time instants. Similarly, upon receiving a null signal from the comparing circuit 424, the PWM controller 406 delivers a zero pulse width at its output by driving a zero value at the output of its amplifier driver circuit, such that the output PWM signal 418 may not have pulses at the corresponding time instants.

In the above manner, the accumulator 308 in the amplifier 300, or the integrating circuit 408 in the amplifier 408, can control the respective PWM controller 306, or PWM controller 406, to generate PWM signal pulses with pulse widths that are greater than or equal to a certain minimum pulse width for the respective amplifier device. Accordingly, the amplifier 300 or the amplifier 400 can be used to generate a single-ended PWM signal that satisfies a respect threshold SNR requirement.

While the implementations described above are for generating single-ended PWM signals, the disclosed techniques can also be used in some cases to generate other PWM signals. For example, in a manner similar to those described above, a differential PWM signal may be generated by using an accumulator or integrating circuit in an amplifier, which compares pulse widths corresponding to incoming signal bit streams to a threshold minimum pulse width for the amplifier. Accordingly, the accumulator or integrating circuit may either control a PWM controller to generate an output pulse for a differential PWM signal, or delay the incoming signal for combining with next incoming signals.

Further aspects of the present invention relate to one or more of the following clauses. In a general aspect, a device includes a combining circuitry that is configured to receive an incoming signal, and one or more delayed signals from a delay circuitry. The combining circuitry is configured to combine the incoming signal and the one or more delayed signals to generate a combined signal. The device includes a comparing circuitry that is configured to receive the combined signal from the combining circuitry, and compare a pulse width of the combined signal to a threshold pulse width. When the pulse width of the combined signal is greater than or equal to the threshold pulse width, the comparing circuitry is configured to provide the combined signal to an amplifier circuit and provides a null signal to the delay circuitry. The amplifier circuit is configured to generate a pulse width modulated (PWM) signal based on the combined signal. When the pulse width of the combined signal is less than the threshold pulse width, the comparing circuitry is configured to provide the null signal to the amplifier circuit and provide the combined signal to the delay circuitry. The amplifier circuit is configured to generate the PWM signal based on the null signal.

Particular implementations can include one or more of the following features. The threshold pulse width can be based on an operational bandwidth of the amplifier circuit. The threshold pulse width can correspond to a minimum signal to noise ratio (SNR) of the PWM signal output by the amplifier circuit.

The device can include the delay circuitry, which can be configured to receive one of the null signal or the combined signal from the comparing circuitry, and provide the null signal or the combined signal to the combining circuitry as a delayed signal.

The combining circuitry can include an adder circuit, which can be configured to add the incoming signal and the one or more delayed signals.

The combining circuitry can include an integrator circuit, which can be configured to integrate the incoming signal with the one or more delayed signals. The integrator circuit can be configured to perform a weighted integration of the one or more delayed signals with the incoming signal to generate the combined signal. Coefficients for the weighted integration can be based on one or more of a signal modulation scheme used by the amplifier circuit, a signal to noise ratio (SNR) of the PWM signal output by the amplifier circuit, a total harmonic distortion and noise (THD+N) parameter of the PWM signal output by the amplifier circuit, or an out of band energy of the PWM signal output by the amplifier circuit.

The integrator circuit can include an $n^{th}$ order integrator, which can be configured to integrate n−1 delayed signals with the incoming signal to generate the combined signal.

The device can include the amplifier circuit. Upon receiving the null signal, the amplifier circuit can be configured to generate a pulse of zero width, and output a zero value corresponding to the PWM signal. Upon receiving the combined signal, the amplifier circuit can be configured to generate a pulse with a pulse width that is greater than or equal to the threshold pulse width, and output the PWM signal with the generated pulse. The amplifier circuit can include a single ended PWM amplifier.

The device can include a sigma delta modulator, which can be configured to receive natural sampling points corresponding to an input signal from a natural sampling point calculation circuit. The sigma delta modulator can be configured to compress a number of bits associated with each natural sampling point, and provide the compressed number of bits associated with each natural sampling point to the combining circuitry as the incoming signal. The device can include the natural sampling point calculation circuit, which can be configured to calculate natural sampling points corresponding to the input signal, and provide the natural sampling points to the sigma delta modulator.

In another general aspect, an incoming signal is received. The incoming signal is combined with one or more delayed signals to generate a combined signal. A pulse width of the combined signal is compared to a threshold pulse width. When the pulse width of the combined signal is greater than or equal to the threshold pulse width, a pulse width modulated (PWM) signal is generated based on the combined signal, and the one or more delayed signals are generated based on a null signal. When the pulse width of the combined signal is less than the threshold pulse width, the PWM signal is generated based on the null signal, and the one or more delayed signals are generated based on the combined signal.

Particular implementations can include one or more of the following features. The threshold pulse width can be based on an operational bandwidth of an amplifier circuit. The threshold pulse width can correspond to a minimum signal to noise ratio (SNR) of the PWM signal output by the amplifier circuit.

Combining the incoming signal and the one or more delayed signals to generate the combined signal can include adding the incoming signal and the one or more delayed signals.

Combining the incoming signal and the one or more delayed signals to generate the combined signal can include integrating the incoming signal with the one or more delayed signals. A weighted integration of the one or more delayed signals with the incoming signal can be performed to generate the combined signal. Coefficients for the weighted integration can be based on one or more of a signal modulation scheme used by an amplifier circuit, a signal to noise ratio (SNR) of the PWM signal output by the amplifier circuit, a total harmonic distortion and noise (THD+N) parameter of the PWM signal output by the amplifier circuit, or an out of band energy of the PWM signal output by the amplifier circuit.

Integrating the incoming signal with the one or more delayed signals can include integrating n−1 delayed signals with the incoming signal to generate the combined signal.

Generating the PWM signal based on the null signal can include generating a pulse of zero width, and outputting a zero value corresponding to the PWM signal.

Implementations of the above include methods, systems, computer program products and computer-readable media. One such system includes one or more processors and a storage device storing instructions that, when executed by the one or more processors, cause the one or more processors to perform the above-described actions. One such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above described actions.

The disclosed and other examples can be implemented as one or more computer program products, for example, one or more modules of computer program instructions encoded on a computer readable medium for execution by, or to control the operation of, data processing apparatus. The implementations can include single or distributed processing of algorithms. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:
1. A device comprising:
   a sigma delta modulator that is configured to:
      receive, from a natural sampling point calculation circuit, natural sampling points corresponding to an input signal,
      compress a number of bits associated with each natural sampling point, and provide the compressed number of bits associated with
each natural sampling point to a combining circuitry
as an incoming signal;
the combining circuitry that is configured to:
receive the incoming signal,
receive one or more delayed signals from a delay
circuitry,
combine the incoming signal and the one or more
delayed signals to generate a combined signal; and
a comparing circuitry that is configured to:
receive, from the combining circuitry, the combined
signal,
compare a pulse width of the combined signal to a
threshold pulse width,
when the pulse width of the combined signal is greater
than or equal to the threshold pulse width:
provide the combined signal to an amplifier circuit,
the amplifier circuit being configured to generate
a pulse width modulated (PWM) signal based on
the combined signal, and
provide a null signal to the delay circuitry, and
when the pulse width of the combined signal is less
than the threshold pulse width:
provide the null signal to the amplifier circuit, the
amplifier circuit being configured to generate the
PWM signal based on the null signal, and
provide the combined signal to the delay circuitry.

2. The device of claim 1, wherein the threshold pulse width is based on an operational bandwidth of the amplifier circuit.

3. The device of claim 2, wherein the threshold pulse width corresponds to a minimum signal to noise ratio (SNR) of the PWM signal output by the amplifier circuit.

4. The device of claim 1, further comprising the delay circuitry that is configured to:
receive one of the null signal or the combined signal from the comparing circuitry; and
provide the null signal or the combined signal to the combining circuitry as a delayed signal.

5. The device of claim 1, wherein the combining circuitry includes an adder circuit that is configured to add the incoming signal and the one or more delayed signals.

6. The device of claim 1, wherein the combining circuitry includes an integrator circuit that is configured to integrate the incoming signal with the one or more delayed signals.

7. The device of claim 6, wherein the integrator circuit is configured to perform a weighted integration of the one or more delayed signals with the incoming signal to generate the combined signal, and
wherein coefficients for the weighted integration are based on one or more of a signal modulation scheme used by the amplifier circuit, a signal to noise ratio (SNR) of the PWM signal output by the amplifier circuit, a total harmonic distortion and noise (THD+N) parameter of the PWM signal output by the amplifier circuit, or an out of band energy of the PWM signal output by the amplifier circuit.

8. The device of claim 1, further comprising the natural sampling point calculation circuit that is configured to:
calculate natural sampling points corresponding to the input signal; and
provide the natural sampling points to the sigma delta modulator.

9. A method comprising:
receiving natural sampling points corresponding to an input signal;
compressing a number of bits associated with each natural sampling point;
providing the compressed number of bits associated with each natural sampling point as an incoming signal,
combining the incoming signal and one or more delayed signals to generate a combined signal;
comparing a pulse width of the combined signal to a threshold pulse width;
when the pulse width of the combined signal is greater than or equal to the threshold pulse width:
generating a pulse width modulated (PWM) signal based on the combined signal,
generating the one or more delayed signals based on a null signal; and
when the pulse width of the combined signal is less than the threshold pulse width:
generating the PWM signal based on the null signal, and
generating the one or more delayed signals based on the combined signal.

10. The method of claim 9, wherein the threshold pulse width is based on an operational bandwidth of an amplifier circuit.

11. The method of claim 10, wherein the threshold pulse width corresponds to a minimum signal to noise ratio (SNR) of the PWM signal output by the amplifier circuit.

12. The method of claim 9, wherein combining the incoming signal and the one or more delayed signals to generate the combined signal comprises:
adding the incoming signal and the one or more delayed signals.

13. The method of claim 9, wherein combining the incoming signal and the one or more delayed signals to generate the combined signal comprises:
integrating the incoming signal with the one or more delayed signals.

14. The method of claim 13, further comprising:
performing a weighted integration of the one or more delayed signals with the incoming signal to generate the combined signal,
wherein coefficients for the weighted integration are based on one or more of a signal modulation scheme used by an amplifier circuit, a signal to noise ratio (SNR) of the PWM signal output by the amplifier circuit, a total harmonic distortion and noise (THD+N) parameter of the PWM signal output by the amplifier circuit, or an out of band energy of the PWM signal output by the amplifier circuit.

15. The method of claim 13, wherein integrating the incoming signal with the one or more delayed signals comprises:
integrating n−1 delayed signals with the incoming signal to generate the combined signal.

16. The method of claim 9, wherein generating the PWM signal based on the null signal comprises:
generating a pulse of zero width; and
outputting a zero value corresponding to the PWM signal.

17. A device comprising:
a combining circuitry that is configured to:
receive an incoming signal,
receive one or more delayed signals from a delay circuitry,
combine the incoming signal and the one or more delayed signals to generate a combined signal, wherein the combining circuitry includes an n$^{th}$ order integrator that is configured to integrate n−1 delayed signals with the incoming signal to generate the combined signal; and a comparing circuitry that is configured to:
  receive, from the combining circuitry, the combined signal,
  compare a pulse width of the combined signal to a threshold pulse width,
  when the pulse width of the combined signal is greater than or equal to the threshold pulse width:
    provide the combined signal to an amplifier circuit, the amplifier circuit being configured to generate a pulse width modulated (PWM) signal based on the combined signal, and
    provide a null signal to the delay circuitry, and
  when the pulse width of the combined signal is less than the threshold pulse width:
    provide the null signal to the amplifier circuit, the amplifier circuit being configured to generate the PWM signal based on the null signal, and
    provide the combined signal to the delay circuitry.

18. The device of claim 17, further comprising the amplifier circuit, wherein upon receiving the null signal, the amplifier circuit is configured to:
  generate a pulse of zero width; and
  output a zero value corresponding to the PWM signal.

19. The device of claim 17, further comprising the amplifier circuit, wherein upon receiving the combined signal, the amplifier circuit is configured to:
  generate a pulse with a pulse width that is greater than or equal to the threshold pulse width; and
  output the PWM signal with the generated pulse.

20. The device of claim 17, wherein the amplifier circuit includes a single ended PWM amplifier.

* * * * *